United States Patent [19]

Hotta

[11] Patent Number: 5,751,657
[45] Date of Patent: May 12, 1998

[54] SEMICONDUCTOR MEMORY DEVICE

[75] Inventor: Yasuhiro Hotta, Nara, Japan

[73] Assignee: Sharp Kabushiki Kaisha, Osaka, Japan

[21] Appl. No.: 788,933

[22] Filed: Jan. 24, 1997

[30] Foreign Application Priority Data

Jan. 26, 1996 [JP] Japan .................... 8-012310

[51] Int. Cl.$^6$ .................................... G11C 8/00
[52] U.S. Cl. .................. 365/238.5; 365/104; 365/204; 365/230.06
[58] Field of Search ............... 365/238.5, 230.03, 365/230.06, 204, 104, 185.12, 185.16

[56] References Cited

U.S. PATENT DOCUMENTS

| | | | |
|---|---|---|---|
| 4,998,223 | 3/1991 | Akaogi | 365/104 X |
| 5,231,603 | 7/1993 | Luhramann | 365/238.5 |
| 5,245,585 | 9/1993 | Voss et al. . | |
| 5,257,235 | 10/1993 | Miyamoto . | |
| 5,293,332 | 3/1994 | Shirai . | |
| 5,305,284 | 4/1994 | Iwase . | |
| 5,341,337 | 8/1994 | Hotta | 365/204 |
| 5,357,477 | 10/1994 | Matsumoto et al. . | |
| 5,398,213 | 3/1995 | Yeon et al. . | |
| 5,493,527 | 2/1996 | Lo et al. | 365/104 |

FOREIGN PATENT DOCUMENTS

| | | |
|---|---|---|
| 0 639 835 | 2/1995 | European Pat. Off. . |
| 5-144255 | 6/1993 | Japan . |

*Primary Examiner*—David C. Nelms
*Assistant Examiner*—Huan Hoang
*Attorney, Agent, or Firm*—Morrison & Foerster, LLP

[57] ABSTRACT

A semiconductor memory device according to the present invention includes: a memory cell array including a plurality of virtual ground lines, a plurality of bit lines, and a plurality of memory cells arranged in a matrix shape; a selection circuit; a first amplifier circuit; a second amplifier circuit; and a first control circuit and a second control circuit. The first control circuit and the second control circuit selectively charge or discharge those of the plurality of virtual ground lines corresponding to one page in accordance with the input address, the first control circuit and the second control circuit performing the charging or discharging independently of each other.

2 Claims, 9 Drawing Sheets

SEMICONDUCTOR MEMORY DEVICE

BACKGROUND OF THE INVENTION

1. Field of the Invention

The present invention relates to a semiconductor memory device, and in particular to a circuit for performing a page-mode reading in a semiconductor memory device having a page mode.

2. Description of the Related Art

In response to recent improvement in the processing speeds of microprocessors or the like, semiconductor memory devices are expected to operate at increasingly higher speeds. In answer to this demand, a semiconductor memory device has been developed which has an enhanced processing speed in the usual random access mode and also has a page mode, which in itself is a high-speed reading mode.

In a read operation under the page mode, a plurality of memory cells are simultaneously selected from a memory cell array, in accordance with the column addresses and row addresses of the input addresses. Once the information contained in these memory cells has been read to a sense amplifier(s), the address for the page mode is varied so that the information stored in the plurality of memory cells can be selectively output at a high speed.

FIG. 4 is a block diagram showing the general structure of a conventional mask ROM (read only memory) having a page mode. FIG. 5 is a circuit diagram showing the structure of a column decoder/selector 230 in the mask ROM in FIG. 4. Among address signals A0 to A19 shown in FIG. 4, A0 and A1 are addresses for the page mode; the address signals A2 to A6 are column addresses; the address signal A7 is a virtual ground line selection/control address; and the address signals A8 to A19 are row addresses.

The conventional page-mode mask ROM 200 shown in FIG. 4 or 5 includes a memory cell array 201, the column decoder/selector 230, and a row decoder 240. The memory cell array 201 includes a plurality of virtual ground lines V0 and V1 (which can be selectively placed at the ground potential in accordance with an external address input to supply a source potential to memory transistors) and a plurality of bit lines B0 and B1 (which are output lines of the memory cells), the virtual ground lines V0 and V1 and the bit lines B0 and B1 alternately interposing each other. The column decoder/selector 230 selects some of the virtual ground lines V0 and V1 and the bit lines B0 and B1 in accordance with an input address. The row decoder 240 selects a word line of the memory cell array 201 in accordance with an input address. As shown in FIG. 5, the memory cell array 201 includes memory cells (e.g., $Q0_{00}$, $Q0_{01}$, $Q0_{11}$, and $Q0_{10}$; and $Q1_{00}$, $Q1_{01}$, $Q1_{11}$, and $Q1_{10}$) corresponding to the respective word lines WLi. The memory cells are composed essentially of field effect transistors (memory transistors) connected between the respectively corresponding virtual ground lines V0 and V1 and the bit lines B0 and B1.

A plurality of sense amplifiers 224 are provided on the output side of the column decoder/selector 230. One of the outputs of the sense amplifiers 224 is selected by a selector 225 to be supplied to an output circuit 226.

The mask ROM 200 also includes an input buffer circuit 211 for receiving the row addresses A8 to A19 and a predecoder(A) 221a coupled to the output of the input buffer circuit 211. The output of the predecoder(A) 221a is supplied to the row decoder 240.

The mask ROM 200 further includes an input buffer circuit 212 for receiving the address signal A7 and an input buffer circuit 213 for receiving the address signals A2 to A6. The output of the input buffer circuit 212 is supplied to the virtual ground line selection/control circuit 222. The output of the input buffer circuit 213 is supplied to a predecoder(B) 221b. The outputs VG0 and VG1 of the virtual ground line selection/control circuit 222 and the output signals CA0 to CA7 and CB0 to CB3 of the predecoder 221b are supplied to the column decoder/selector 230.

The mask ROM 200 further includes an input buffer circuit 214 for receiving the addresses A0 and A1 for the page mode and a page mode decoder 223 coupled to the output of the input buffer circuit 214. The output signals P0 to P3 of the page mode decoder 223 are supplied to the selector 225.

As shown in FIG. 5, the column decoder/selector 230 includes a column decoder 230a and a column selector 230b. The column decoder 230a includes a NAND circuit $231a_0$ which receives the output signals CA0 and CB0 of the predecoder(B) 221b, an invertor $231b_0$ coupled to the output of the NAND circuit $231a_0$, a NAND circuit $231a_1$ receiving the output signals CA1 and CB0 of the predecoder(B) 221b, and an invertor $231b_1$ coupled to the output of the NAND circuit $231a_1$. Although not fully illustrated in FIG. 5, the column decoder 230a includes a number of the abovementioned NAND circuits and invertors corresponding to 32 pages. The column addresses A2 to A6 can address 32 pages of data.

The column selector 230b includes a plurality of column selection transistors for selecting virtual ground lines and bit lines in accordance with the output signal of the column decoder 230a. In FIG. 5 are exemplified column selection transistors $TV_{00}$ and $TV_{10}$ for supplying the selection control signal VG0 to one end of the respectively corresponding memory transistors, as well as column selection transistors $TV_{01}$ and $TV_{11}$ for supplying the selection control signal VG1 to one end of the respectively corresponding memory transistors. The gates of the column selection transistors $TV_{00}$ and $TV_{01}$ are coupled to the output CS0 of the invertor $231_{b0}$. The gates of the column selection transistors $TV_{10}$ and $TV_{11}$ are coupled to the output CS1 of the invertor $231_{b1}$.

In addition, FIG. 5 illustrates column selection transistors $TB_{00}$ and $TB_{10}$ for coupling the other end of the respectively corresponding memory transistors to a common bit line CBIT0, as well as column selection transistors $TB_{01}$ and $TB_{11}$ for coupling the other end of the respectively corresponding memory transistors to a common bit line CBIT1. The gates of the column selection transistors $TB_{00}$ and $TB_{01}$ are coupled to the output CS0 of the invertor $231_{b0}$. The gates of the column selection transistors $TB_{10}$ and $TB_{11}$ are coupled to the output CS1 of the invertor $231_{b1}$.

As shown in FIG. 5, the selector 225 includes transistors $225a_0$ to $225a_3$, which receive the outputs of the sense amplifiers $224a_0$ to $224a_3$ and are opened or closed in accordance with the output signals P0 to P3 of the page mode decoder 223.

As shown in FIG. 6, the virtual ground line selection/control circuit 222 includes a p-channel transistor 222c and an n-channel transistor 222d connected in series between a bias circuit 222a and the ground level, as well as a p-channel transistor 222e and an n-channel transistor 222f connected in series between a bias circuit 222b and the ground level. The gates of the transistors 222c and 222d receive the address signal A7. The gates of the transistors 222e and 222f receive the address signal A7 via an invertor 222g. The control signal VG0 is output from a junction between the transistors 222c and 222d. The control signal VG1 is output from a junction between the transistors 222e and 222f.

Next, the operation of the above-described conventional page-mode mask ROM 200 will be described.

A read operation in the usual random access mode occurs in the mask ROM 200 of the above-mentioned structure in accordance with changes in the values of the address signals A0 to A19.

First, when the row addresses A8 to A19 are input to the predecoder 221a via the input buffer circuit 211, a predecode signal is output from the predecoder(A) 221a to the row decoder 240. Then, the row decoder 240 makes one of the word lines WLi in the memory cell array 201 active (or the "High" level in this example).

When the column addresses A2 to A6 are input to the predecoder(B) 221b via the input buffer circuit 213, one of the output signals CA0 to CA7 and one of the output signals CB0 to CB3 of the predecoder 221b become active (or the "High" level) in accordance with the values of the column addresses A2 to A6, as shown in Tables 1 and 2 (truth value tables) below.

TABLE 1

| A4 | A3 | A2 | CA0 | CA1 | CA2 | CA3 | CA4 | CA5 | CA6 | CA7 |
|----|----|----|-----|-----|-----|-----|-----|-----|-----|-----|
| L  | L  | L  | H   |     |     |     |     |     |     |     |
| L  | L  | H  |     | H   |     |     |     |     |     |     |
| L  | H  | L  |     |     | H   |     |     |     |     |     |
| L  | H  | H  |     |     |     | H   |     |     |     |     |
| H  | L  | L  |     |     |     |     | H   |     |     |     |
| H  | L  | H  |     |     |     |     |     | H   |     |     |
| H  | H  | L  |     |     |     |     |     |     | H   |     |
| H  | H  | H  |     |     |     |     |     |     |     | H   |

TABLE 2

| A6 | A5 | CB0 | CB1 | CB2 | CB3 |
|----|----|-----|-----|-----|-----|
| L  | L  | H   |     |     |     |
| L  | H  |     | H   |     |     |
| H  | L  |     |     | H   |     |
| H  | H  |     |     |     | H   |

For example, when the output signals CA0 and CB0 become active, only the signal CS0, among the output signals CS0 to CS3 of the column decoder circuit 230a, becomes active ("High") so that column selection transistors receiving the signal CS0 are turned "ON".

As shown in FIG. 6, as the selection control signal VG0 shifts to the ground potential in accordance with the address signal A7 and the selection control signal VG1 is placed by the bias circuit 222b at a level equal to that of the bit line (i.e., the "High" level), the memory transistors $Q0_{00}$ and $Q0_{10}$ in the circuit shown in FIG. 5 are selected, so that the information stored in the selected memory cells is transmitted to the common bit lines CBIT0 and the CBIT1 via the column selection transistors $TB_{00}$ and $TB_{01}$ and input to the sense amplifiers 224a. Thus, the page data is read to the sense amplifiers 224a.

Thereafter, as shown in Table 3 (truth value table), only one of the output signals P0 to P3 of the page mode decoder 223 becomes active ("High") in accordance with the changes in the address signals A0 and A1 for the page mode. As a result, one of the sense amplifier outputs SA0 to SA3 is quickly output via the selector 225.

TABLE 3

| A1 | A0 | P0 | P1 | P2 | P3 |
|----|----|----|----|----|----|
| L  | L  | H  |    |    |    |
| L  | H  |    | H  |    |    |
| H  | L  |    |    | H  |    |
| H  | H  |    |    |    | H  |

Moreover, when the column addresses continuously change in sequence in the mask ROM 200 of the above-mentioned structure, e.g., when the addresses indicated by the column address signals A2 to A6 shift from address 0 to address 1, the output CS0 (page selection output) of the invertor $231_{b0}$ becomes inactive (or the "Low" level) and the output CS1 (page selection output) of the invertor $231_{b0}$ becomes active (or the "High" level). At this time, the memory transistors $Q1_{00}$ and $Q1_{10}$ are selected, and the information stored in the selected memory transistors $Q1_{00}$ and $Q1_{10}$ is transmitted to the common bit lines CBIT0 and CBIT1 via the column selection transistors $TB_{10}$ and $TB_{11}$ and input to the sense amplifier circuit.

However, the read operation under the above-mentioned page switching occurs in the usual random access mode, rather than in any high-speed mode. In other words, the above-described configuration cannot achieve a high-speed reading under the page mode.

In order to solve this problem, a structure has been disclosed which can perform a high-speed reading even when sequentially switching the column addresses (defining the switching of pages) to continuously read page data in the page mode.

FIG. 7 is a block diagram illustrating the general structure of an improved mask ROM 300 having a page mode. FIG. 8 is a circuit diagram showing the detailed structure of a column decoder/selector 330 in the mask ROM in FIG. 7. Among address signals A0 to A19 shown in FIG. 7, A0 and A1 are addresses for the page mode; the address signals A2 to A6 are column addresses; the address signal A7 is a virtual ground line selection/control address; and the address signals A8 to A19 are row addresses.

The components of the conventional page-mode mask ROM 300 which also appear in the mask ROM 200 are indicated by the same numerals as used in FIGS. 4 and 5. The conventional page-mode mask ROM 300 includes a column decoder/selector 330 and a page mode decoder 323, which are respectively distinct from the column decoder/selector 230 and the page mode decoder 223 of the mask ROM 200. In contrast to the conventional mask ROM 200, the conventional mask ROM 300 includes two groups of sense amplifiers, namely, a first group (0) of sense amplifiers 324a and a second group (1) of sense amplifiers 324b.

As shown in FIG. 8, the column decoder/selector 330 includes a column decoder 330a and a column selector 330b. The column decoder 330a includes a NAND circuit $331a_0$ receiving the output signals CA0 and CB0 of the predecoder 221b, a NAND circuit $331b_0$ coupled to the output of the NAND circuit $331a_0$ and a signal CC31, a NAND circuit $331a_1$ receiving the output signals CA1 and CB0 of the predecoder(B) 221b, and a NAND circuit $331b_1$ coupled to the outputs of the NAND circuits $331a_1$ and $331a_0$.

Although not fully illustrated in FIG. 8, the column decoder 330a includes a number of the above-mentioned NAND circuits (receiving the predecoder output) and the NAND circuits (outputting the page selection signal) corresponding to 32 pages. The column addresses A2 to A6 can address 32 pages of data.

The column selector 330b includes a plurality of column selection transistors for selecting virtual ground lines and bit lines in accordance with the output signal of the column decoder 330a. In FIG. 8 are exemplified column selection transistors $TV_{00}$ and $TV_{10}$ for supplying the selection control signal VG0 to one end of the respectively corresponding memory transistors, as well as column selection transistors $TV_{01}$ and $TV_{11}$ for supplying the selection control signal VG1 to one end of the respectively corresponding memory transistors.

The gates of the column selection transistors $TV_{00}$ and $TV_{01}$ are coupled to the output of the NAND circuit $331_{b0}$. The gates of the column selection transistors $TV_{10}$ and $TV_{11}$ are coupled to the output of the NAND circuit $331_{b1}$. Also illustrated in FIG. 8 are column selection transistors $TB_{00}$ to $TB_{02}$ for coupling the other end of the respectively corresponding memory transistors to common bit lines CBITA0 to CBITA2, as well as column selection transistors $TB_{01}$ to $TB_{12}$ for coupling the other end of the respectively corresponding memory transistors to common bit lines CBITB0 to CBITB2.

The gates of the column selection transistors $TB_{00}$ and $TB_{02}$ are coupled to the output of the NAND circuit $331_{b0}$. The gates of the column selection transistors $TB_{10}$ to $TB_{12}$ are coupled to the output of the NAND circuit $331_{b1}$.

In addition to receiving the address signals A0 and A1 via the input buffer circuit 214, the page mode decoder 323 receives the address signal A2 via the input buffer circuit 213, and outputs the addresses P0 to P7 for the page mode to the selector 325.

As shown in FIG. 8, the selector 325 includes transistors $325a_0$ to $325a_2$, which receive the outputs of the first group of sense amplifiers(0) $324a_0$ to $324a_2$ and are opened or closed in accordance with the output signals P0 to P3 of the page mode decoder 323, and transistors $325b_0$ to $325b_2$, which receive the outputs of the second group of sense amplifiers(1) $324b_0$ to $324b_2$ and are opened or closed in accordance with the output signals P4 to P6 of the page mode decoder 323.

Although FIG. 8 illustrates only 3 sense amplifiers $324a_0$ to $324a_2$ for the first group of sense amplifiers and $324b_0$ to $324b_2$ for the second group of sense amplifiers, the first and second groups of sense amplifiers are each actually composed of 4 sense amplifiers; the selector 325 is composed of 8 transistors; and 4 common bit lines are provided corresponding to each group of sense amplifiers. Furthermore, although FIG. 8 illustrates circuitry equivalent to only 2 pages of the column decoder/selector 330, the column decoder/selector 330 actually includes circuitry equivalent to as many pages as there are combinations of the output signals CA0 to CA7 and the output signals CB0 to CB3 of the predecoder(B) 221b (i.e., 32 pages).

Similarly, in the conventional mask ROM 300, a read operation in the usual random access mode occurs in accordance with changes in the values of the address signals A0 to A19.

First, when the row addresses A8 to A19 are input to the predecoder(A) 221a via the input buffer circuit 211, a predecode signal is output from the predecoder 221a to the row decoder 240. Then, the row decoder 240 makes one of the word lines WLi in the memory cell array 201 active (or the "High" level in this example).

When the column addresses A2 to A6 are input to the predecoder(B) 221b via the input buffer circuit 213, one of the output signals CA0 to CA7 and one of the output signals CB0 to CB3 of the predecoder 221b become active (or the "High" level) in accordance with the values of the column addresses A2 to A6, as shown in Tables 1 and 2 (truth value tables) above.

For example, when the output signals CA0 and CB0 become active, the output CC0 of the NAND circuit $331a_0$ becomes active ("Low" level). Not only does the output signal CS0 (page selection output) of the column decoder circuit 230a become active ("High") but also the page selection output signal CS1 corresponding to the next column address becomes active ("High"), so that column selection transistors receiving the output signals CS0 and CS1 of the column decoder are turned "ON".

In the virtual ground line selection/control circuit 222 shown in FIG. 6, the memory transistors $Q0_{00}$, $Q0_{10}$, ..., etc. and $Q1_{00}$, $Q1_{10}$, ..., etc. are selected as the selection control signal VG0 shifts to the ground potential in accordance with the address signal A7 and the selection control signal VG1 is placed by the bias circuit 222b at the same level as the level of the bit line, so that the information stored in the selected memory cells is transmitted to the common bit lines CBITA0, CBITA1, ..., etc. and CBITB0, CBITB1, ..., etc. via the column selection transistors $TB_{00}$ and $TB_{01}$ and $TB_{10}$ and $TB_{11}$ so as to be input to the first and second groups of sense amplifiers 324a and 324b. Thus, page data equivalent to 2 pages is simultaneously read.

Thereafter, as shown in Table 4 (truth value table) below, only one of the output signals P0 to P7 of the page mode decoder 323 becomes active ("High") in accordance with the address signals A0, A1, and A2 for the page mode. As a result, one of the sense amplifier outputs SA0 to SA3 or SB0 to SB3 is quickly output via the selector 325.

TABLE 4

| A2 | A1 | A0 | P0 | P1 | P2 | P3 | P4 | P5 | P6 | P7 |
|----|----|----|----|----|----|----|----|----|----|----|
| L  | L  | L  | H  |    |    |    |    |    |    |    |
| H  | H  | H  |    | H  |    |    |    |    |    |    |
| H  | H  | L  |    |    | H  |    |    |    |    |    |
| H  | H  | H  |    |    |    | H  |    |    |    |    |
| H  | L  | L  |    |    |    |    | H  |    |    |    |
| H  | L  | H  |    |    |    |    |    | H  |    |    |
| H  | H  | L  |    |    |    |    |    |    | H  |    |
| H  | H  | H  |    |    |    |    |    |    |    | H  |

SUMMARY OF THE INVENTION

A semiconductor memory device according to the present invention includes: a memory cell array including a plurality of virtual ground lines, a plurality of bit lines, and a plurality of memory cells arranged in a matrix shape, the plurality of virtual ground lines and the plurality of bit lines alternately interposing each other, the plurality of memory cells being classified into a plurality of groups, and the memory cell array having a page mode, wherein one of the virtual ground lines shifts to a ground level to allow data stored in one or more of the plurality of memory cells to be read to one or more of the plurality of bit lines, the page mode allowing data stored in one of the plurality of classified groups to be read in accordance with an input address; a selection circuit for, in accordance with the input address, selecting the memory cells in one of the plurality of classified groups corresponding to a column address of the input address and selecting the memory cells in another of the plurality of classified groups corresponding to another column address; a first amplifier circuit for amplifying data stored in the one of the plurality of classified groups corresponding to the column address of the input address; a second amplifier circuit for amplifying data stored in the other of the plurality of classified groups corresponding to the other column address; and a first control circuit and a second control circuit for selectively charging or discharging those of the plurality of virtual ground lines corresponding to one page in accordance with the input address, the first control circuit and the second control circuit performing the charging or discharging independently of each other.

In one embodiment of the invention, the selection circuit selects one of the plurality of memory cells corresponding to a next row address when the column address of the input address indicates the last address of the column address. Herein, the next row refers to a row next to the row that is selected while the memory cell addressed by the last address is being read.

Thus, the invention described herein makes possible the advantage of providing a semiconductor memory device capable of achieving a quick read from all the memory cells along the column direction.

This and other advantages of the present invention will become apparent to those skilled in the art upon reading and understanding the following detailed description with reference to the accompanying figures.

DESCRIPTION OF THE PREFERRED EMBODIMENTS (Example 1)

Figure 1:
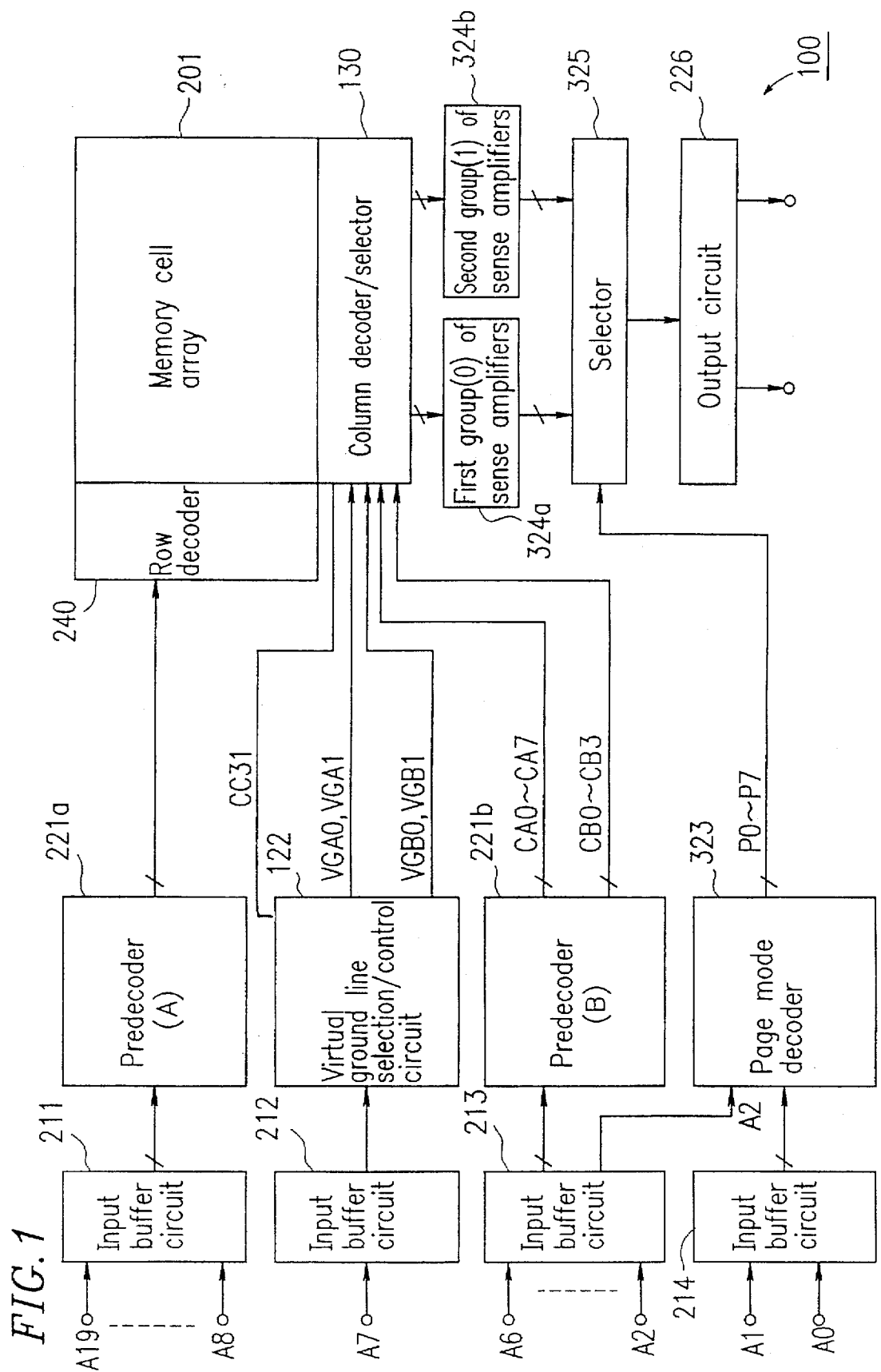
FIG. 1 is a block diagram illustrating a semiconductor memory device according to Example 1 of the present invention, the semiconductor memory device being a mask ROM 100 having a page mode.
Figure 2:
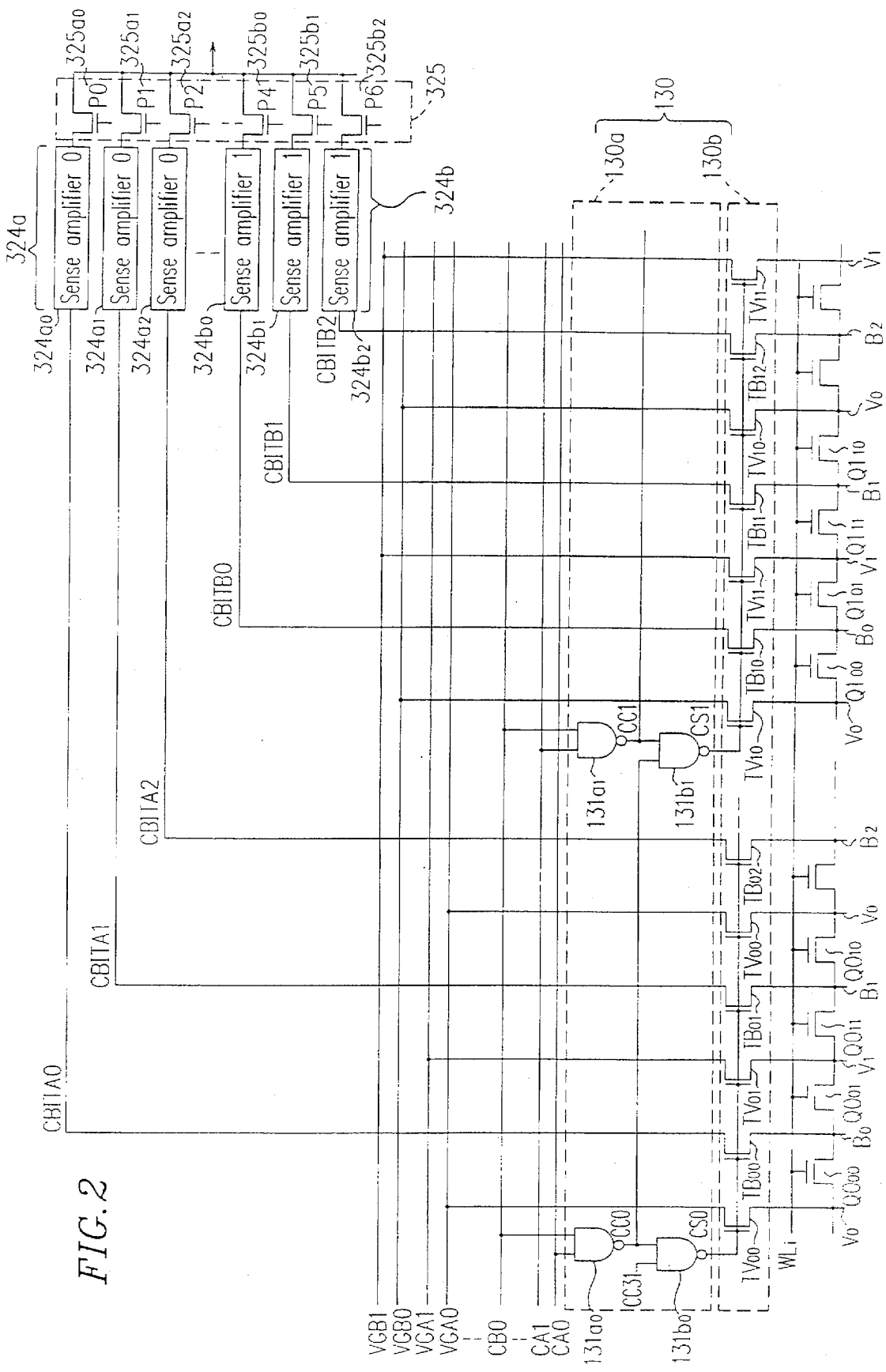
FIG. 2 is a circuit diagram showing the detailed structure of a column decoder/selector 130 in the mask ROM 100 in FIG. 1.
Figure 3:
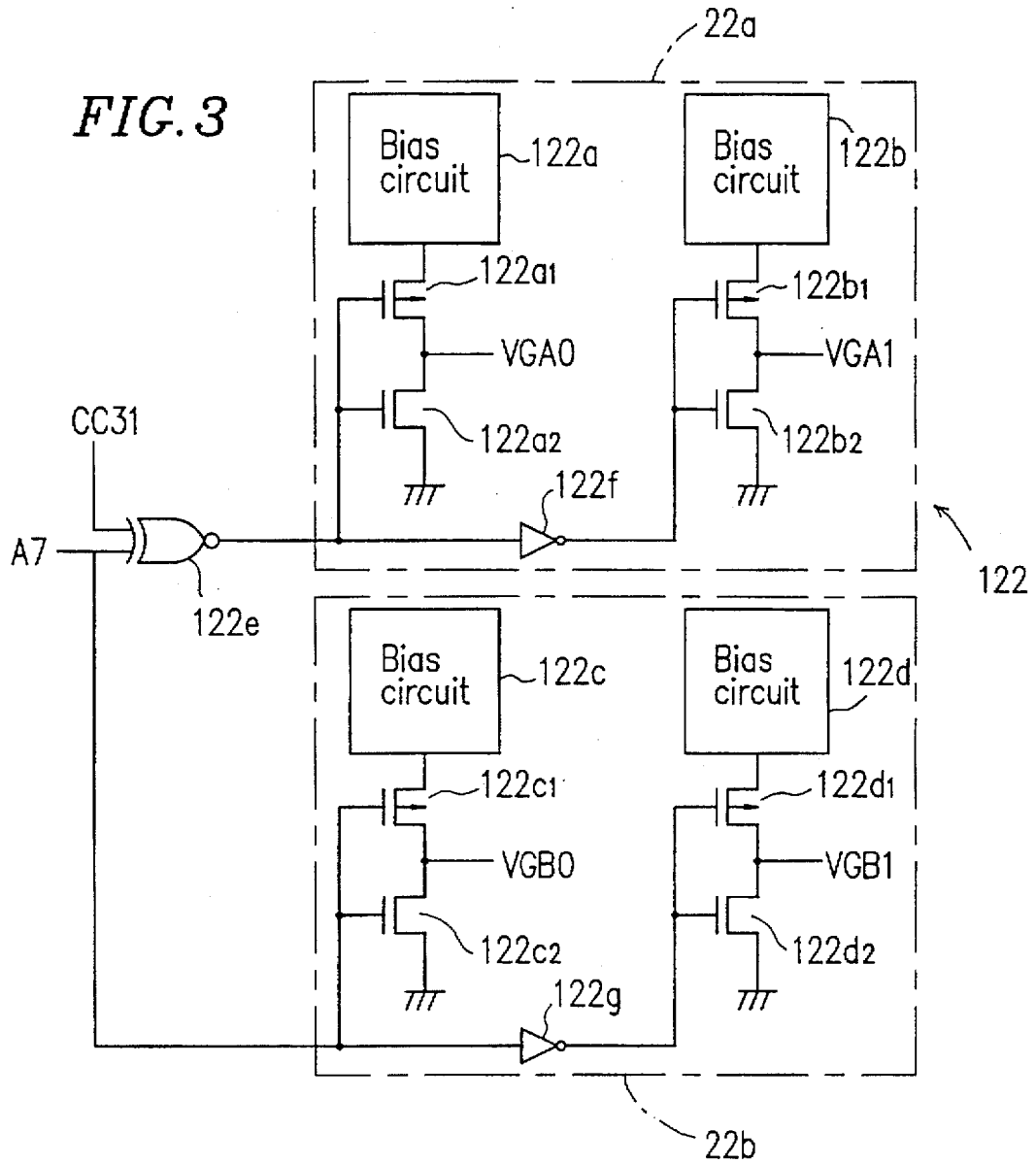
FIG. 3 shows the circuitry of a virtual ground line selection/control circuit 122 in the mask ROM 100 in FIG. 1.
Figure 4:
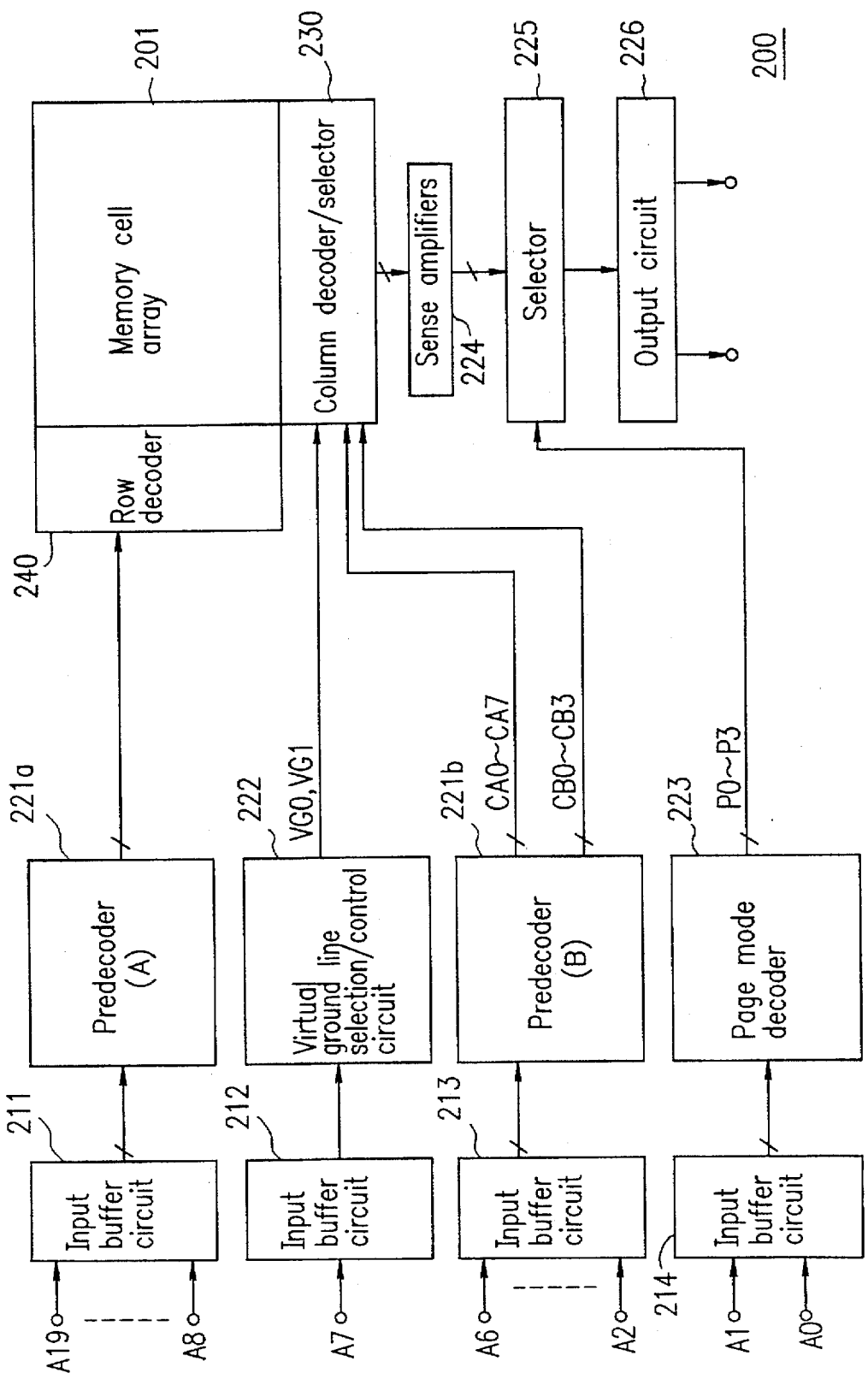
FIG. 4 is a block diagram showing the general structure of a conventional mask ROM having a page mode.
Figure 5:
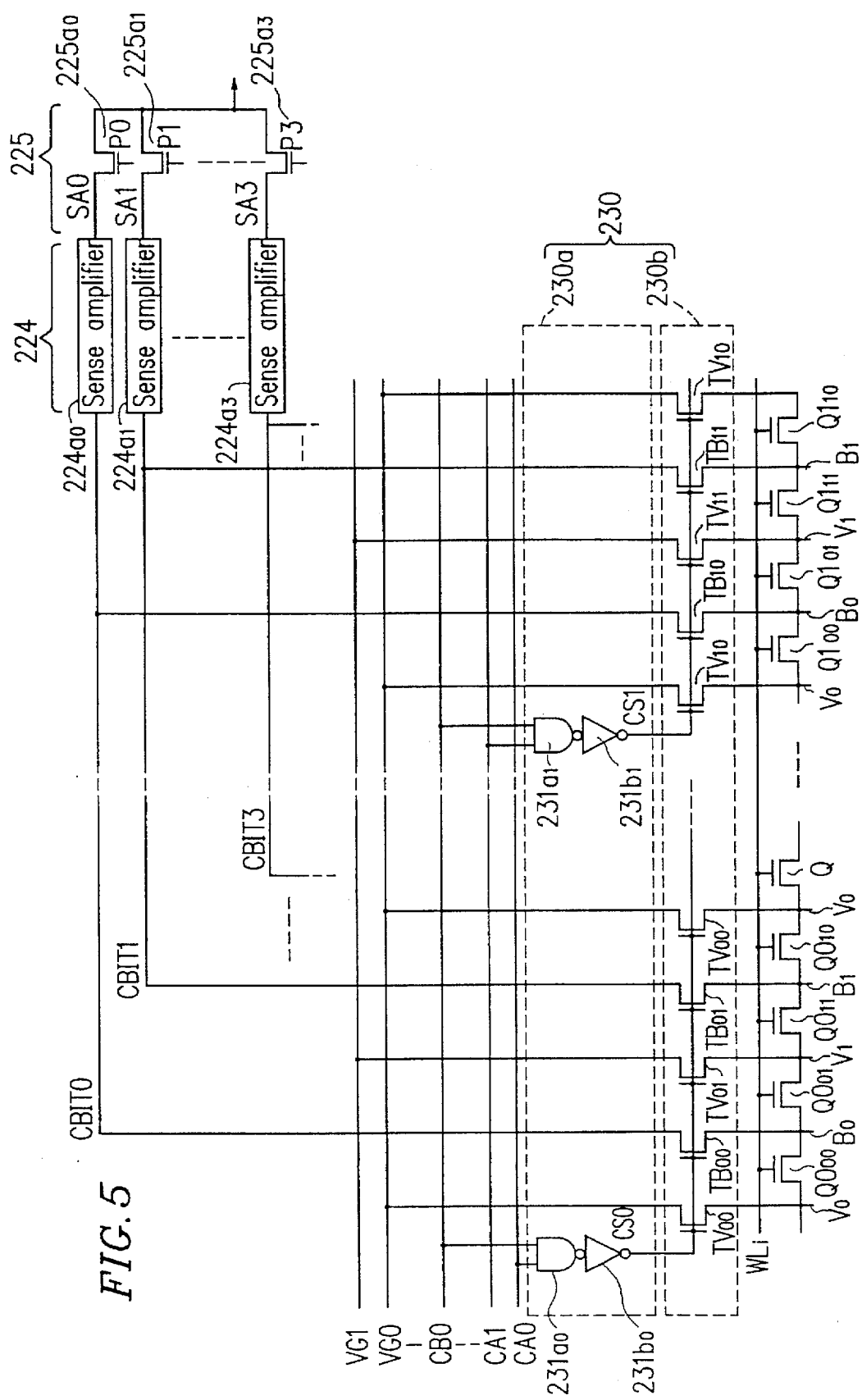
FIG. 5 is a circuit diagram showing the structure of a column decoder/selector in the conventional mask ROM in FIG. 4.
Figure 6:
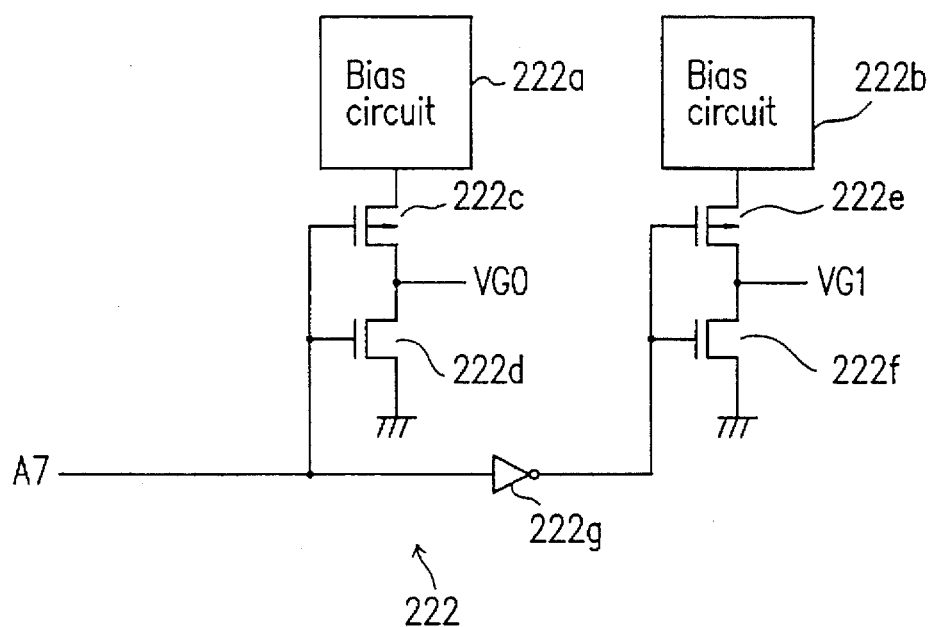
FIG. 6 shows the circuitry of a virtual ground line selection/control circuit in the conventional mask ROM in FIG. 4.

FIG. 1 is a block diagram illustrating a semiconductor memory device according to Example 1 of the present invention. The semiconductor memory device is a mask ROM 100 having a page mode. FIG. 2 is a circuit diagram showing the detailed structure of a column decoder/selector 130 in the mask ROM 100 from FIG. 1. FIG. 3 shows the specific circuit structure of a virtual ground line selection/ control circuit 122 in the mask ROM 100. Among address signals A0 to A19 shown in FIG. 1, A0 and A1 are addresses for the page mode; the address signals A2 to A6 are column addresses; the address signal A7 is a virtual ground line selection/control address; and the address signals A8 to A19 are row addresses.

Figure 7:
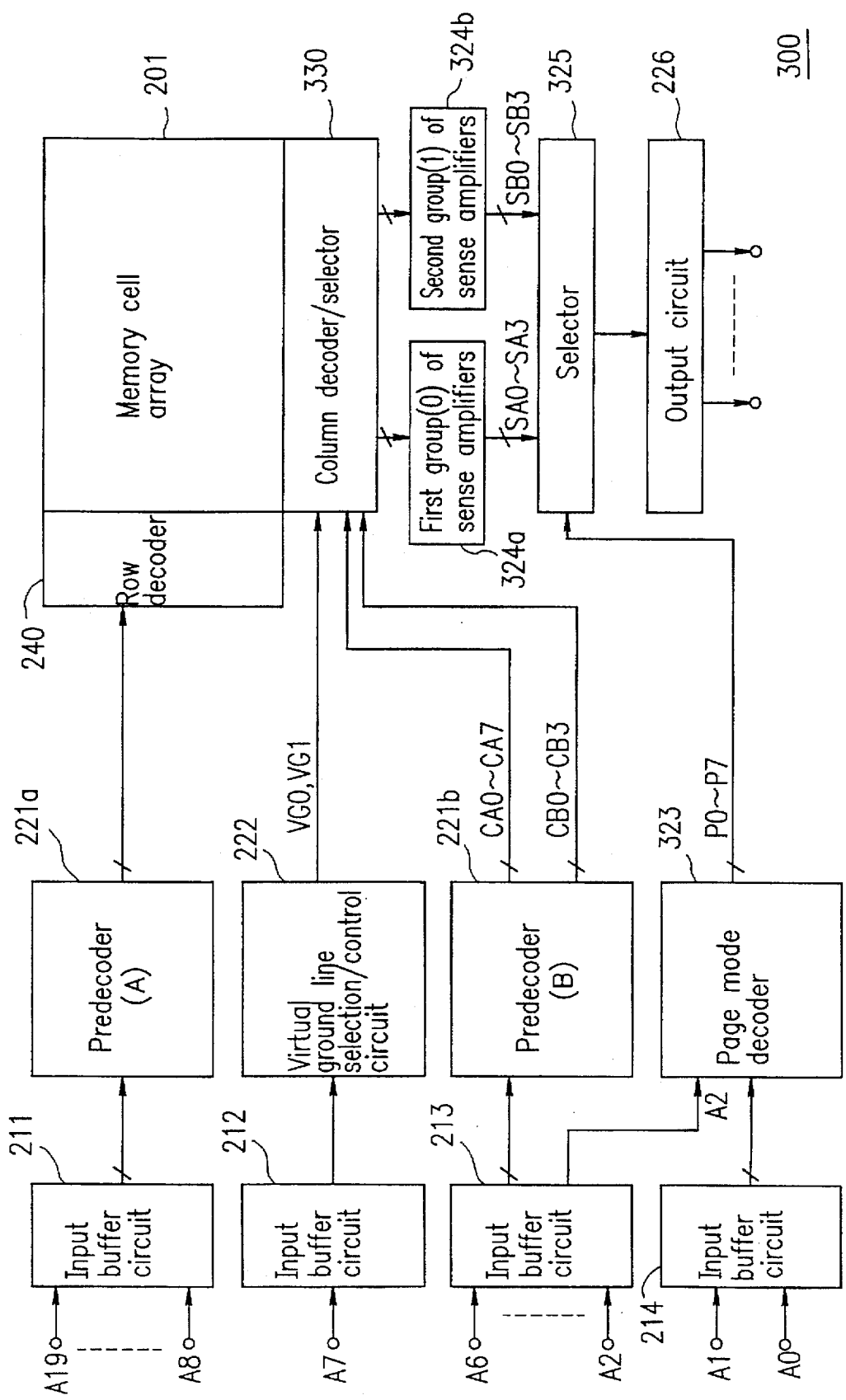
FIG. 7 is a block diagram showing the general structure of an improved conventional mask ROM having a page mode.
Figure 8:
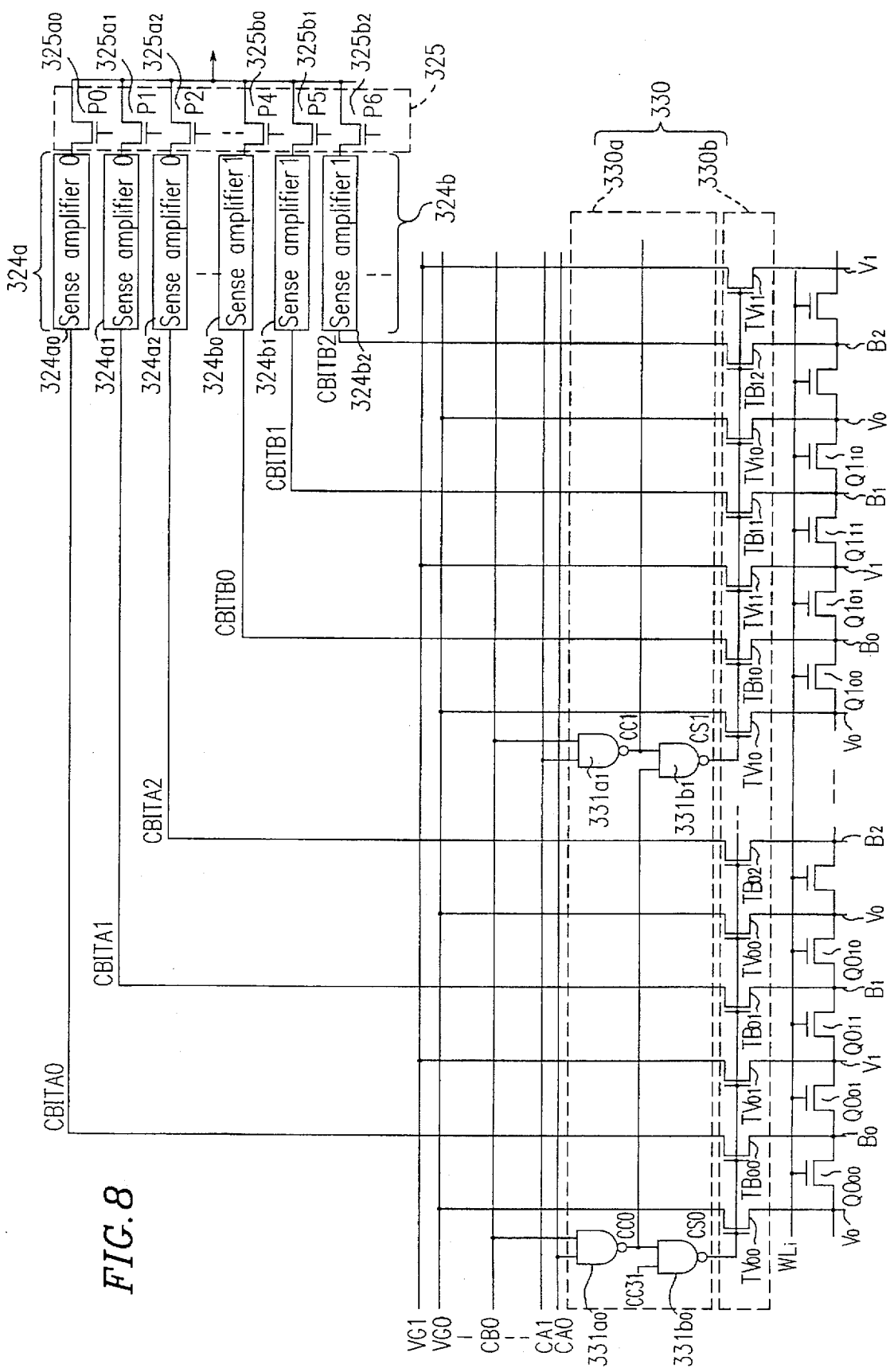
FIG. 8 is a diagram showing the circuitry of a column decoder/selector and a selector in the conventional mask ROM in FIG. 7.

The components of the page-mode mask ROM 100 according to Example 1 which also appear in the mask ROM 300 are indicated by the same numerals as used in FIGS. 7 and 8.

The page-mode mask ROM 100 includes a column decoder/selector 130 and a virtual ground line selection/ control circuit 122, which are respectively distinct from the column decoder/selector 330 and the virtual ground line selection/control circuit 222 of the mask ROM 300.

As shown in FIG. 2, the column decoder/selector 130 includes a column decoder 130a and a column selector 130b. The column decoder 130a includes a NAND circuit $131a_0$ receiving the output signals CA0 and CB0 of a predecoder (B) $221b$, a NAND circuit $131b_0$ coupled to the output of the NAND circuit $131a_0$ and a signal CC31, a NAND circuit $131a_1$ receiving the output signals CA1 and CB0 of the predecoder $221b$, and a NAND circuit $131b_1$ coupled to the outputs of the NAND circuits $131a_1$ and $131a_0$.

Although not fully illustrated in FIG. 2, the column decoder $130a$ includes 32 NAND circuits (corresponding to the page number) receiving corresponding ones of the outputs CA0 to CA7 of the predecoder $221b$ and corresponding ones of the outputs CB0 to CB3 of the predecoder $221b$, including the two illustrated NAND circuits $131a_0$ and $131a_1$. Similarly, the column decoder $130a$ includes 32 NAND circuits (corresponding to the page number) receiving the output of the above NAND circuit and the output of the NAND circuit for the previous page, including the two illustrated NAND circuits $131b_0$ and $131b_1$. The NAND circuit for the last page, receiving the outputs CA7 and CB3 of the predecoder(B) $221b$ outputs the above-mentioned signal CC31.

The column selector $130b$ includes a plurality of column selection transistors for selecting virtual ground lines and bit lines in accordance with the output signal of the column decoder $130a$. In FIG. 2 are exemplified column selection transistors $TV_{00}$ and $TV_{10}$ for supplying the selection control signals VGA0 and VGB0 (respectively) to one end of the corresponding memory transistors, as well as column selection transistors $TV_{01}$ and $TV_{11}$ for supplying the selection control signals VGA1 and VGB1 (respectively) to one end of the respectively corresponding memory transistors.

The gates of the column selection transistors $TV_{00}$ and $TV_{01}$ are coupled to the output of the NAND circuit $131_{b0}$. The gates of the column selection transistors $TV_{10}$ and $TV_{11}$ are coupled to the output of the NAND circuit $131_{b1}$. Also illustrated in FIG. 2 are column selection transistors $TB_{00}$ to $TB_{02}$ for coupling the other end of the respectively corresponding memory transistors to common bit lines CBITA0 to CBITA2, as well as column selection transistors $TB_{01}$ to $TB_{12}$ for coupling the other end of the respectively corresponding memory transistors to common bit lines CBITB0 to CBITB2.

The gates of the column selection transistors $TB_{00}$ and $TB_{02}$ are coupled to the output of the NAND circuit $131_{b0}$. The gates of the column selection transistors $TB_{10}$ to $TB_{12}$ are coupled to the output of the NAND circuit $131_{b1}$.

As shown in FIG. 3, the virtual ground line selection/ control circuit 122 includes first and second control circuits 22a and 22b which charge and discharge the virtual ground line and an XOR (exclusive OR) circuit 122e receiving the above-mentioned signal CC31 and the address signal A7.

The first control circuit 22a includes a p-channel transistor $122a_1$ and an n-channel transistor $122a_2$ connected in series between a bias circuit 122a and the ground level, as well as a p-channel transistor $122b_1$ and an n-channel transistor $122b_2$ connected in series between a bias circuit 122b and the ground level. The gates of the transistors $122a_1$ and $122a_2$ receive the output of the XOR circuit 122e. The gates of the transistors $122b_1$ and $122b_2$ receive the output of the XOR circuit 122e via an invertor 122f. The control signal VGA0 is output from a junction between the transistors $122a_1$ and $122a_2$. The control signal VGA1 is output from a junction between the transistors $122b_1$ and $122b_2$.

The second control circuit 22b includes a p-channel transistor $122c_1$ and an n-channel transistor $122c_2$ connected in series between a bias circuit 122c and the ground level, as well as a p-channel transistor $122d_1$ and an n-channel transistor $122d_2$ connected in series between a bias circuit 122d and the ground level. The gates of the transistors $122c_1$ and $122c_2$ receive the address signal A7. The gates of the transistors $122d_1$ and $122d_2$ receive the address signal A7 via an invertor 122g. The control signal VGB0 is output from a junction between the transistors $122c_1$ and $122c_2$. The control signal VGB1 is output from a junction between the transistors $122d_1$ and $122d_2$.

Next, the operation of the above-described page-mode mask ROM 100 of Example 1 will be described.

In the mask ROM 100, a read operation in the usual random access mode occurs in accordance with changes in the values of the address signals A0 to A19.

First, when the row addresses A8 to A19 are input to the predecoder(A) 221a via the input buffer circuit 211, a predecode signal is output from the predecoder(A) 221a to the row decoder 240. Then, the row decoder 240 makes one of the word lines WLi in the memory cell array 201 active (or the "High" level in this example).

When the column addresses A2 to A6 are input to the predecoder 221b, one of the output signals CA0 to CA7 and one of the output signals CB0 to CB3 of the predecoder(B) 221b become active (or the "High" level) in accordance with the values of the column addresses A2 to A6, as shown in Tables 1 and 2 (truth value tables) above.

For example, when the output signals CA0 and CB0 become active, the output CC0 of the first NAND circuit $131a_0$ of the column decoder 130a becomes active ("Low" level). Not only does the output signal CS0 of the column decoder 130a become active ("High") but also the signal CS1 corresponding to the next column address becomes active ("High"), so that column selection transistors receiving the output signals CS0 and CS1 of the column decoder are turned "ON".

When the input address signals A2 to A6 indicate address 0, the outputs CA0 and CB0 of the predecoder 221b are selected, and the output CS0 of the NAND circuit $131_{b0}$ corresponding to the outputs CA0 and CB0, becomes active (or the "Low" level), and the output CS0 (page selection output) corresponding to address 0 and the output CS1 (page selection output) corresponding to the next address (i.e., address 1) become active (or the "High" level). At this time, the address signal A7 is at the "High" level, and the output CC31 of the NAND circuit of the last column of the column decoder 130a is also at the "High" level. Therefore, the virtual ground line selection/control circuit 122 places the virtual ground lines VGA0 and VGB0 at the GND level, and the virtual ground lines VGA1 and VGB1 at a potential level equal to the Bit line potential level.

With the above-described timing, the memory transistors $Q0_{00}, Q0_{10}, \ldots$, etc. and $Q1_{00}, Q1_{10}, \ldots$, etc. are coupled to the common bit lines CBITA0, CBITA1, . . . , and CBITB0, CBITB1, . . . , respectively. As a result, the information stored in the selected memory transistors is input to the first group (0) of sense amplifiers 324a and the second group (1) of sense amplifiers 324b. Next, responsive to the addresses A0 to A1 and A2, the outputs P0 to P7 of the page mode decoder 323 sequentially turn ON the transistors $325a_0, 325a_1, \ldots$, etc. and $325b, 325b_1, \ldots$, etc. of the selector 325, thereby outputting the corresponding data to the outside. Thus, the page data is sequentially and continuously read.

When the column address input signals A2 to A6 indicate address 1F, the inputs CA7 and CB3 of the NAND circuit corresponding to these addresses become active ("High"), and the output CC31 thereof becomes active ("Low" level). As a result, the column decoder output CS31 corresponding to the input addresses becomes active ("High" level) so that the appropriate portion of the column selector 130b is turned ON. The next column address is set in the page selection output CS0. The corresponding column selection transistor is turned ON as the page selection output CS0 becomes active ("High" level).

If the address signals A2 to A6 shift to address 1F (by hexadecimal notation) while the address signal A7 is at the "High" level, i.e., while the memory cell column corresponding to the virtual ground line V0 is being read, the input signal CC31 of the virtual ground line selection/control circuit 122 shifts to the "Low" level, and the virtual ground line VGA0 shifts to the potential equal to the bit line potential and the virtual ground line VGA1 shifts to the GND level.

As described above, according to Example 1 of the present invention, even when the column address undergoes a change which requires the potentials of the virtual ground lines VGA0 and VGA1 to be set at different levels, i.e., switching pages from the last page to the top page, the data of both pages can be simultaneously read to the sense amplifiers 324a and 324b, thereby enabling a quick reading of the data.

Thus, according to the present example, a plurality of columns of memory cells within a page corresponding to the column address of the input address are simultaneously selected, and a plurality of columns of memory cells within another page corresponding to the column address of another address are simultaneously selected by the column decoder/selector 130. Furthermore, the first and second groups of sense amplifiers 324a and 324b are employed to sense the data read from the plurality of memory cells simultaneously selected from within the corresponding page and the data read from the plurality of memory cells simultaneously selected from within another page, respectively. As a result, at least two pages of page data corresponding to at least two column addresses, including the column address of the input address, can be continuously read.

Moreover, the first and second control circuits 22a and 22b selectively charge or discharge the virtual ground lines corresponding to one page responsive to the input address so that the charging/discharging of the virtual ground lines by the first and second control circuits 22a and 22b can be separately performed in accordance with the input address. As a result, it is possible to switch the virtual ground line for the columns of memory cells within one page while reading the data from another page. As a result, it is possible to continuously read data in memory cells on the same word line even when switching pages from the last page to the top page. Thus, a fast and continuous reading of page data is achieved by merely incorporating two circuits (i.e., the first and second control circuits 22a and 22b in FIG. 3) for charging/discharging the virtual ground lines for one page.

In contrast, the improved conventional mask ROM 300 illustrated in FIGS. 7 and 8 has a problem in that, although accesses to the memory cells $Q0_{00}$, $Q1_{0}$, ..., $Q1_{00}$, $Q1_{10}$, ..., etc. coupled to the virtual ground line VG0 in the case of continuously changing column addresses can be achieved quickly as long as the virtual ground line VG0 maintains the "Low" level, accesses to the memory cells $Q0_{01}$, $Q0_{11}$, ..., $Q1_{01}$, $Q1_{11}$, ..., etc. coupled to the virtual ground line VG1 occur as random accesses (i.e., low speed reading) because the virtual ground lines VG1 and VG0 must be placed at the "Low" and "High" levels, respectively.

(Example 2)

Figure 9:
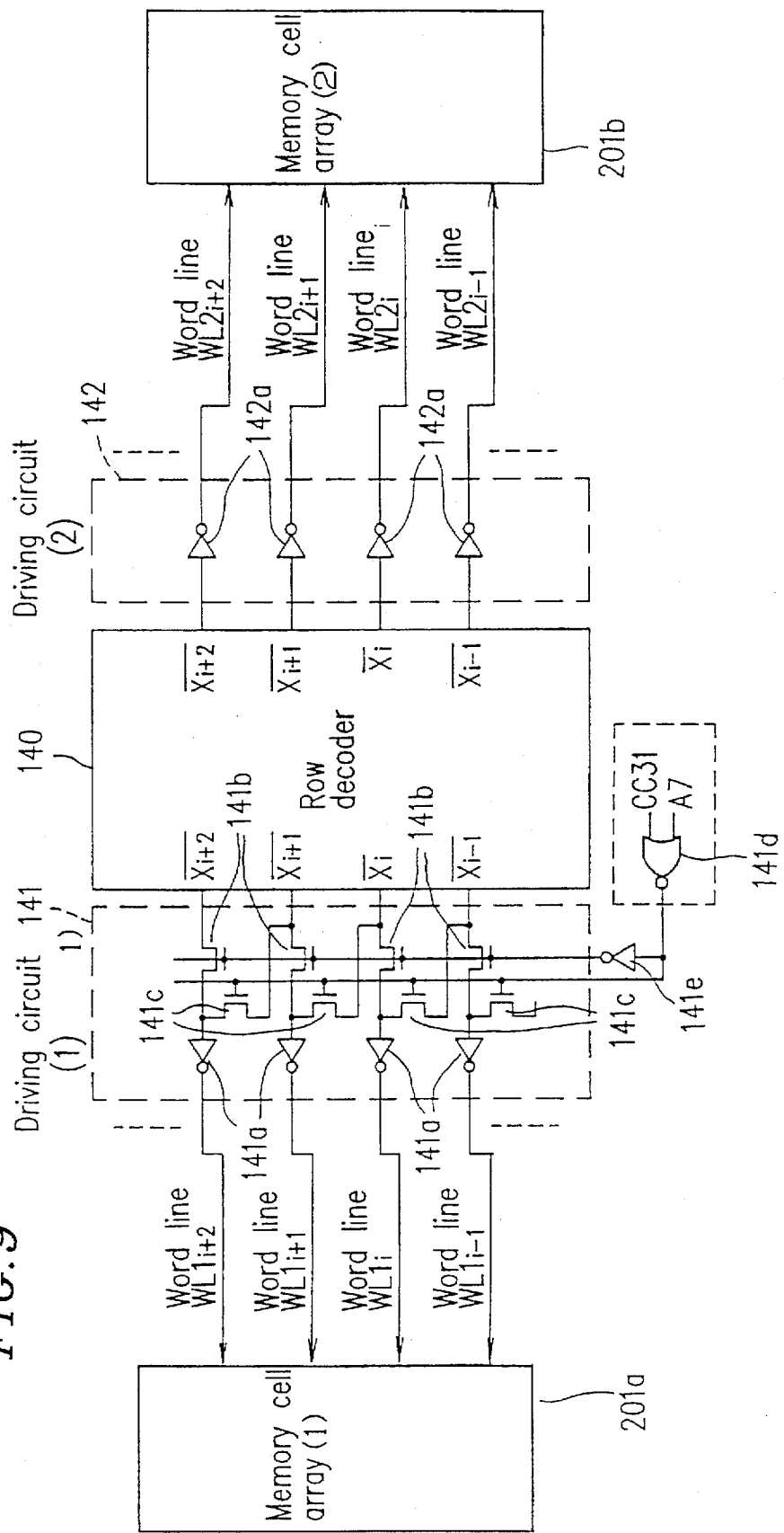
FIG. 9 is a block diagram illustrating a row decoder structure of a semiconductor memory device according to Example 2 of the present invention.

FIG. 9 is a diagram illustrating a semiconductor memory device (mask ROM) according to Example 2 of the present invention. In addition to the circuitry of the column decoder in the mask ROM 100 of Example 1, the column decoder in the mask ROM of the present example also includes a circuit which automatically selects, after all the memory cells corresponding to one word line have been read, the next word line. For conciseness, FIG. 9 only illustrates a memory cell array, a row decoder, and a driving circuit coupled to the output of the row decoder for driving word lines. The memory cell array is shown to include first and second memory cell arrays 201a and 201b. The structure of the mask ROM of Example 2 is otherwise the same as that of the mask ROM 100 of Example 1.

In FIG. 9, 140 denotes a row decoder of the mask ROM of Example 2. The row decoder 140 includes a first (1) driving circuit 141 coupled to the output of the row decoder 140 and driving a word line WL1 of the first memory cell array 201a and a second (2) driving circuit 142 coupled to the output of the row decoder 140 and driving a word line WL2 of the second memory cell array 201b. Otherwise the row decoder 140 has the same internal circuitry as that of the row decoder of Example 1.

The first driving circuit 141 includes an invertor 141a corresponding to the $k^{th}$ word line $WL1_k$, a first transistor 141b coupled between the invertor 141a and the $k^{th}$ output $\overline{X}_k$ of the row decoder 140, and a second transistor 141c coupled between the invertor 141a corresponding to the $k^{th}$ word line $WL1_k$ and the $(k-1)^{th}$ output $\overline{X}_{k-1}$ of the row decoder 140. Herein, k represents an integer from 0, 1, ..., i−1, i, i+1, ..., to M, where M represents the number of word lines.

The first driving circuit 141 is controlled by a signal from the control circuit 141d. The control circuit 141d includes an NOR circuit receiving the signal CC31 and the address signal A7, where the gates of the first transistors 141b receive the output of the NOR circuit via the invertor 141e and the gates of the second transistors 141c directly receive the output of the NOR circuit.

The second driving circuit 142 includes a plurality of invertors 142a corresponding to the respective word lines.

Next, the operation of the above-described mask ROM of Example b 2will be described.

In the mask ROM of Example 2, the address signal A7 is at the "Low" level when the data from all the memory cells corresponding to one word line has been read. Since the signal CC31 is at the "Low" level (i.e., active) at this point in time, the output of the NOR circuit 141d is at the "High" level, so that the next word line is selected.

When the input addresses A8 to A19 have set the $i^{th}$ output Xi of the row decoder 140 at the "Low" level (i.e., active), the driving circuits 141 and 142 accordingly set the word lines WL1i and WL2i at the "High" level (i.e., active). If the input address signals A2 to A6 indicate an address in the range from address 00 to address 1E, the signal CC31 (which is input to the control circuit 141d) is inactive ("High"), so that the word lines WL1i and WL2i become active ("High") responsive to the row decoder output signal Xi.

When data is read by sequentially shifting the input address signals A2 to A6 from address 00 to address 1F with the address signal A7 (which is input to the virtual ground line selection/control circuit 122) being set at the "High" level, the signal CC31 becomes active ("Low") as the values of the input address signals A2 to A6 shift to address 1F, thereby switching the levels of the virtual ground lines VGA0 and VGA1 as in Example 1.

Thereafter, the address signals A2 to A6 are sequentially selected from the top address (i.e., address 00) to the last address (i.e., address 1F) while maintaining the address signal A7 at the "Low" level. As the values of the address signals A2 to A6 shift to address 1F, the NAND output CC31 becomes active ("Low"), which causes the column decoder output CS31 to become active ("High") and the column decoder output CS0 to become active ("High"). Since the output signals CC31 and the address signal A7 are both at the "Low" level at this time, the active level ("Low") of the output $\overline{X}_i$ of the row decoder 140 is coupled to the word lines $WL1_{i+1}$ and $WL2i_{i+1}$ of the next stage, so that the word lines $WL1_{i+1}$ and $WL2_{i+1}$ become active ("High"). The above-mentioned coupling is determined based on the output of the NOR circuit 141d.

Hence, in Example 2, the column address (page) is switched depending on whether or not the virtual ground lines VGA0 and VGA1 and VGB0 and VGB1 are at the GND level or the Bit line level, even when the input address (column address) selects the last address. Moreover, when all the memory cells corresponding to a given word line have been read, the next word line is automatically selected, so that a fast reading of the memory cell corresponding to the next word line can be performed.

As described above, in accordance with the semiconductor memory device of the present invention, it is possible to quickly read continuous page data even when the address undergoes a change which requires the switching of the column address and the potentials of the virtual ground lines.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
a memory cell array including a plurality of virtual ground lines, a plurality of bit lines, and a plurality of memory cells arranged in a matrix shape, the plurality of virtual ground lines and the plurality of bit lines alternately interposing each other, the plurality of memory cells being classified into a plurality of groups, and the memory cell array having a page mode, wherein data stored in one or more of the plurality of memory cells is read to one or more of the plurality of bit lines, the page mode allowing data stored in one of the plurality of classified groups to be read in accordance with an input address;

a selection circuit for, in accordance with the input address, selecting the memory cells in one of the plurality of classified groups corresponding to a column address of the input address and selecting the memory cells in another of the plurality of classified groups corresponding to another column address;

a first amplifier circuit for amplifying data stored in the one of the plurality of classified groups corresponding to the column address of the input address;

a second amplifier circuit for amplifying data stored in the other of the plurality of classified groups corresponding to the other column address; and a first control circuit and a second control circuit for selectively charging or discharging those of the plurality of virtual ground lines corresponding to one page in accordance with the input address, the first control circuit and the second control circuit performing the charging or discharging independently of each other.

2. A semiconductor memory device according to claim 1, wherein the selection circuit selects one of the plurality of memory cells corresponding to a next row address when the column address of the input address indicates a last address.

* * * * *